United States Patent [19]
Shigehara et al.

[11] Patent Number: 5,739,702
[45] Date of Patent: Apr. 14, 1998

[54] BUS HOLD CIRCUIT

[75] Inventors: Hiroshi Shigehara, Oita; Masanori Kinugasa, Yokohama, both of Japan

[73] Assignee: Kabushiki Kaisha Toshiba, Kawasaki, Japan

[21] Appl. No.: 704,995

[22] Filed: Aug. 29, 1996

[30] Foreign Application Priority Data

Aug. 31, 1995 [JP] Japan .................................. 7-224218

[51] Int. Cl.⁶ .............................................. H03K 19/0175
[52] U.S. Cl. ................................ 326/86; 326/30; 326/83
[58] Field of Search ........................... 326/21, 30, 33–34, 326/62, 82, 83, 86

[56] References Cited

U.S. PATENT DOCUMENTS

| | | | |
|---|---|---|---|
| 5,227,677 | 7/1993 | Furman | 326/30 X |
| 5,329,190 | 7/1994 | Igarashi et al. | 326/30 X |
| 5,347,177 | 9/1994 | Lipp | 326/30 |
| 5,498,976 | 3/1996 | Hwang | 326/82 X |
| 5,532,630 | 7/1996 | Waggoner et al. | 326/21 X |
| 5,592,509 | 1/1997 | McClear et al. | 375/219 |
| 5,661,417 | 8/1997 | Kondoh | 326/86 X |

OTHER PUBLICATIONS

Computer Design, (Japanese magazine) Feb. 1994, pp. 92–93.

Primary Examiner—David R. Hudspeth
Attorney, Agent, or Firm—Foley & Lardner

[57] ABSTRACT

The bus hold circuit comprises: an input stage inverter (IN1) connected between a first supply voltage (Vcc) terminal and a second supply voltage (Vss) terminal and including: a first P-channel transistor (P1); and a first N-channel transistor (N1) connected in series to the first P-channel transistor, a gate of the first P-channel transistor and a gate of the first N-channel transistor being connected in common to a bus line (INA); and an output stage inverter (IN2) also connected between the first supply voltage (Vcc) terminal and the second supply voltage (Vss) terminal and including: a second P-channel transistor (P4); a third P-channel transistor (P2) connected in series to the second P-channel transistor; and a second N-channel transistor (N2) connected in series to the third P-channel transistor, a gate of the second P-channel transistor (P4) being connected to the bus line (Lout), a gate of the third P-channel transistor (P2) and a gate of the second N-channel transistor (N2) being connected in common to a drain of the first P-channel transistor (P1) and a drain of the first N-channel transistor (N1), a drain of the third P-channel transistor (P2) and a drain of the second N-channel transistor (N2) being connected in common to the bus line (Lout). In particular, back gates (i.e., the N-type well) of the first second and third P-channel transistors (P1, P4 and P2) are all connected to a source of the P-channel transistor (P2), respectively. Therefore, it is possible to prevent unnecessary current from flowing to the supply voltage terminal of the bus hold circuit, even if an output circuit supplied with a supply voltage different from that of the bus hold circuit is connected to the bus line.

23 Claims, 10 Drawing Sheets

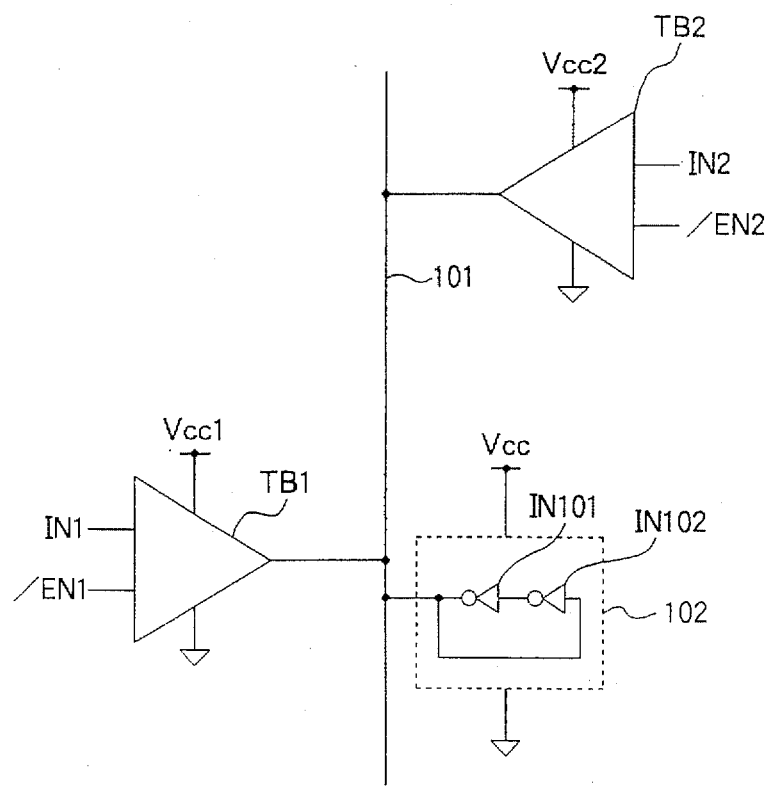
F I G. 1

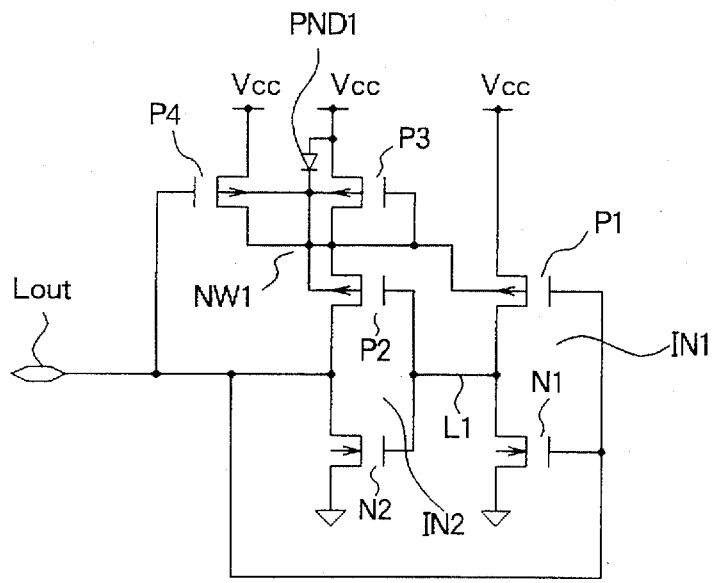
F I G. 5
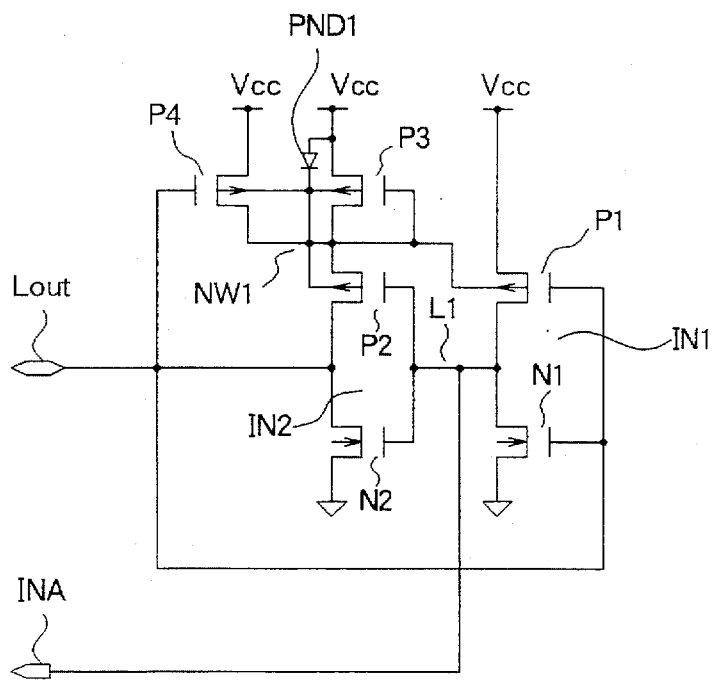
F I G. 6

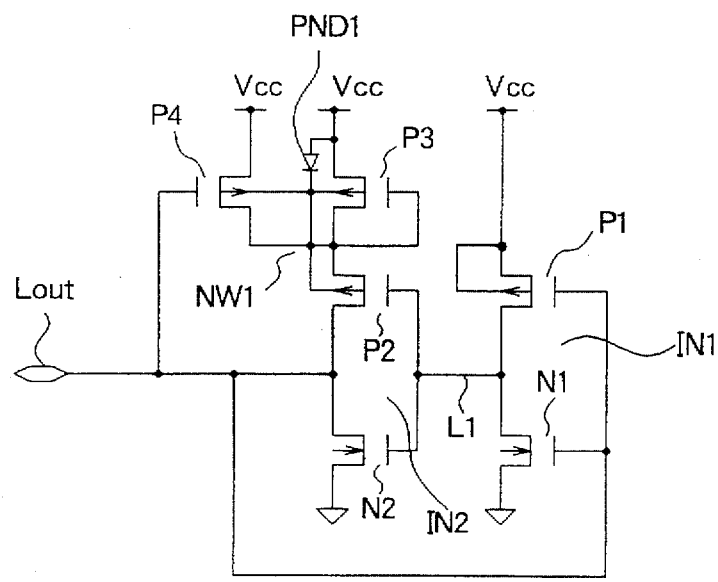
F I G. 9
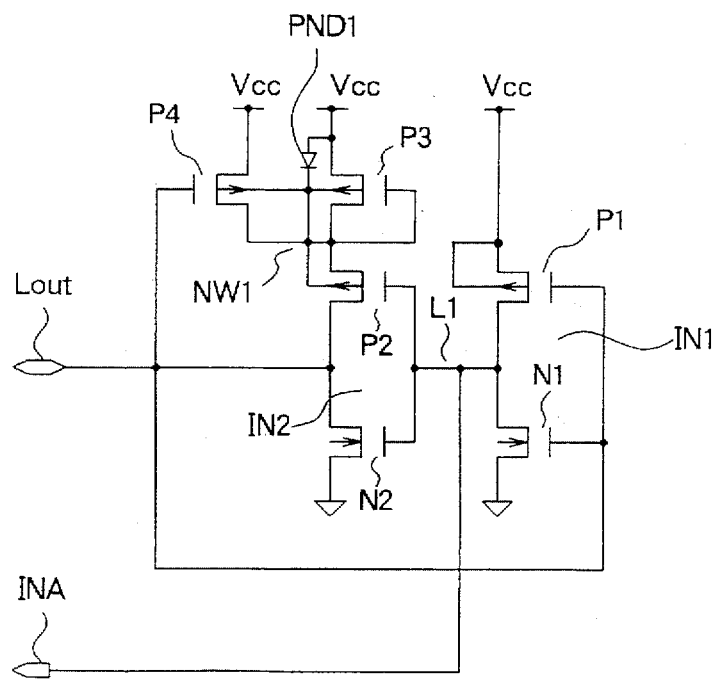
F I G. 10

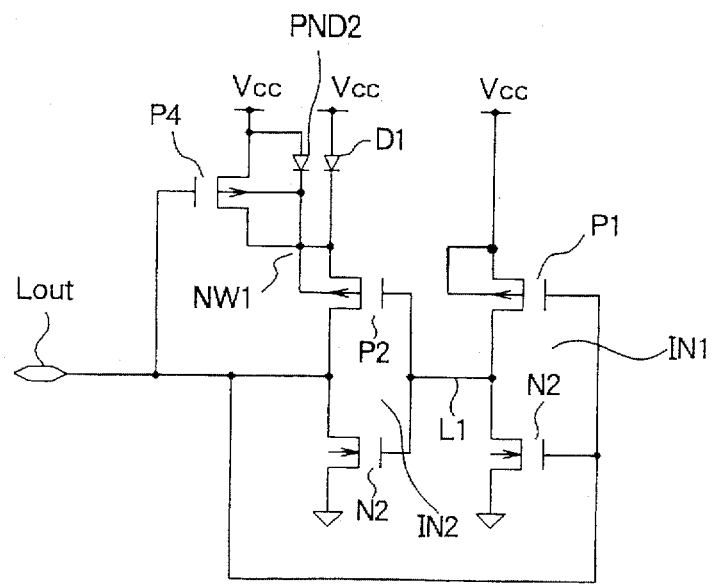
F I G. 11
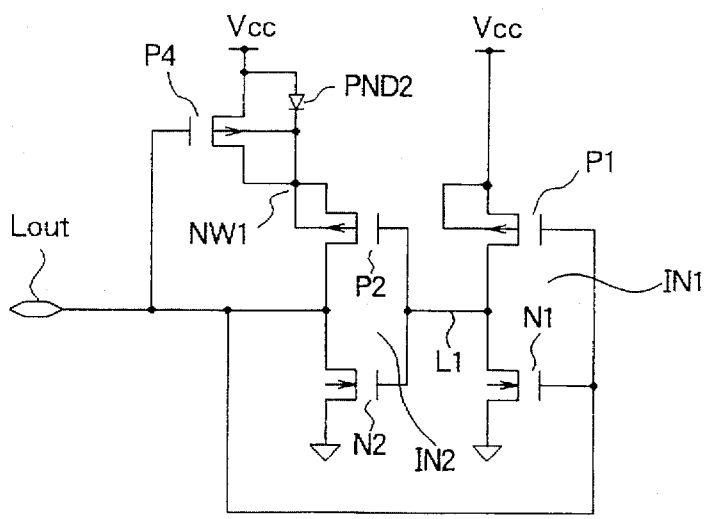
F I G. 12

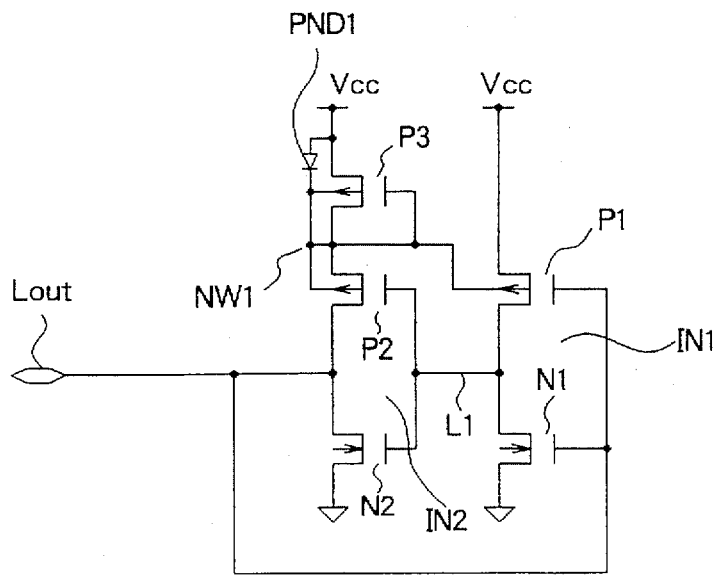
F I G. 13
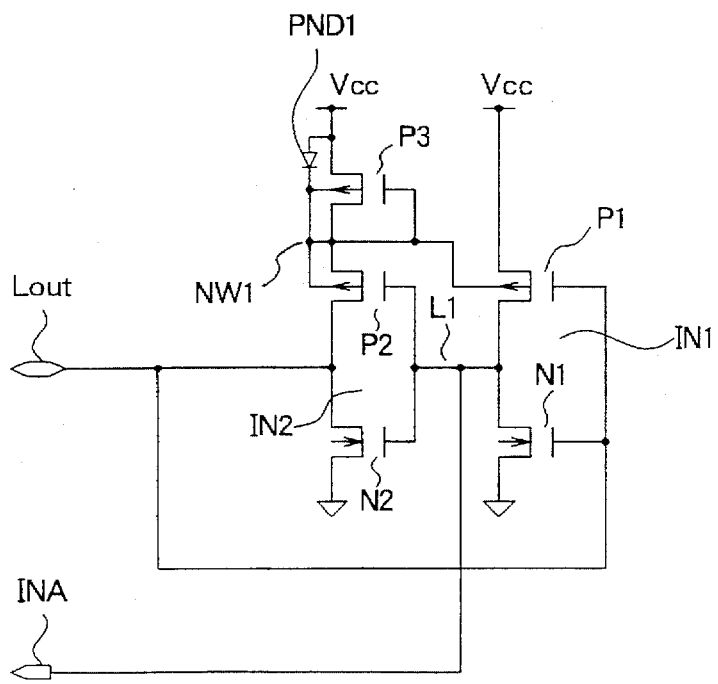
F I G. 14

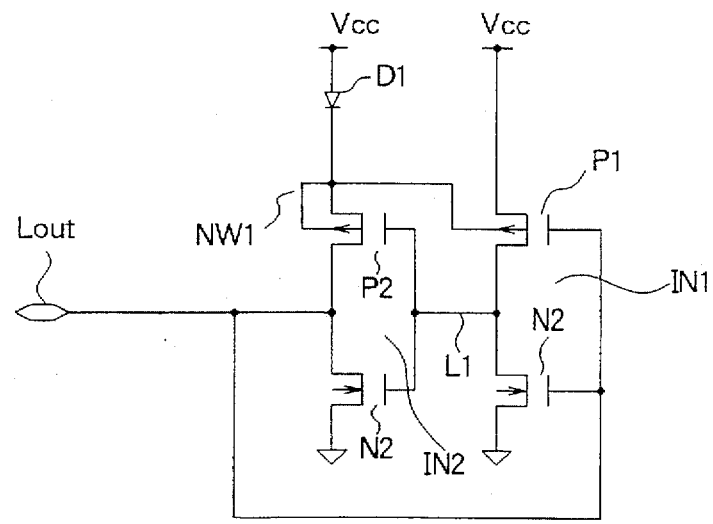
F I G. 15
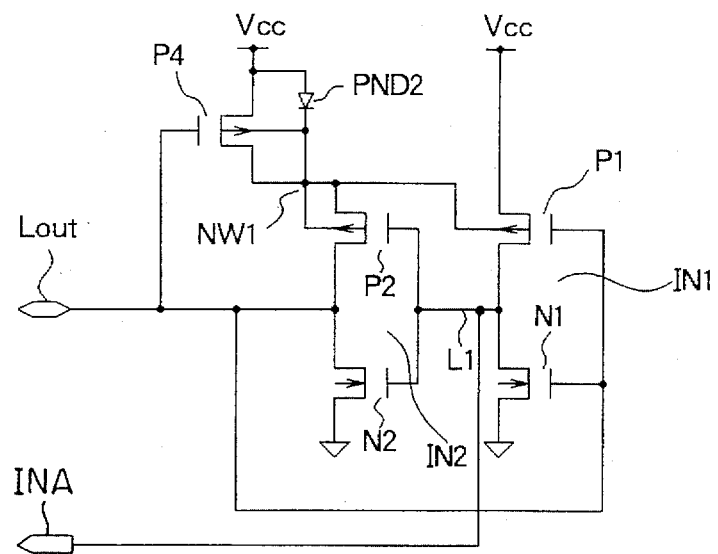
F I G. 16

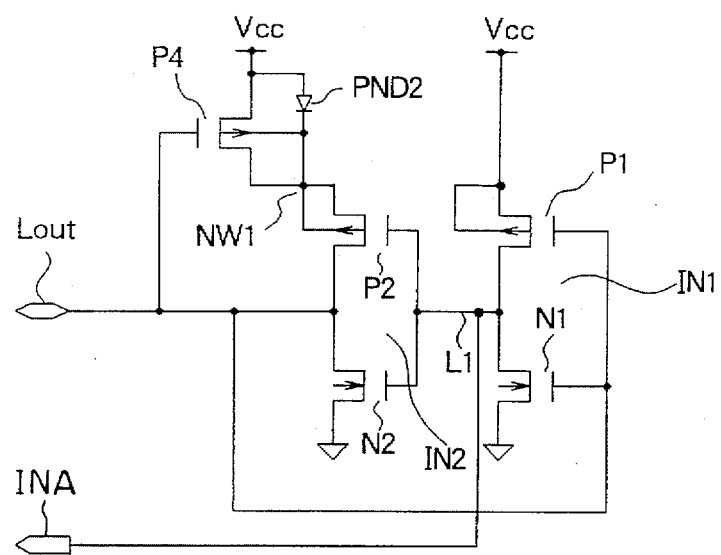
F I G. 17

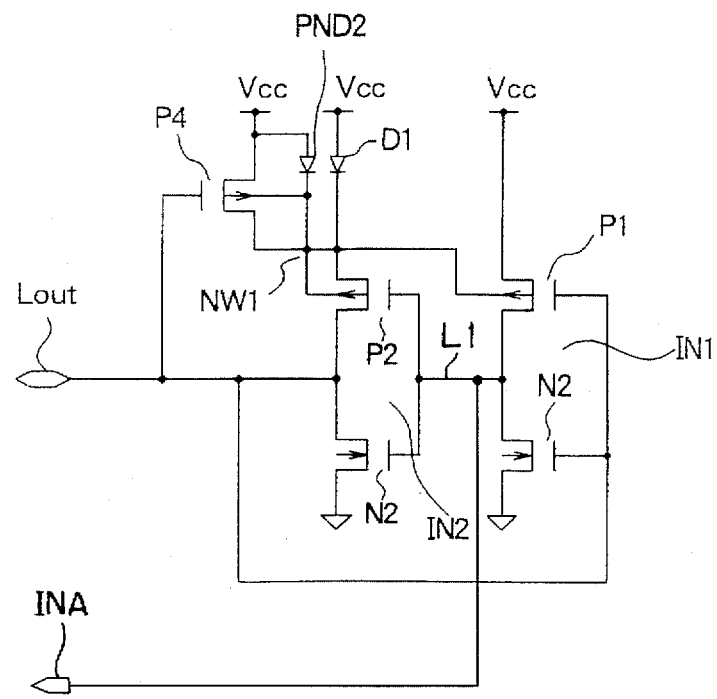
F I G. 18
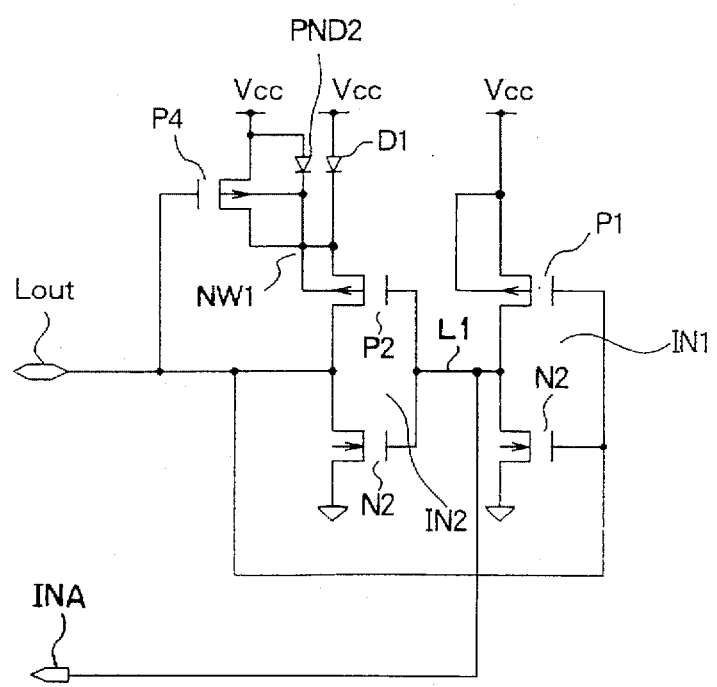
F I G. 19

BUS HOLD CIRCUIT

BACKGROUND OF THE INVENTION

The present invention relates to a bus hold circuit, and more specifically to a bus hold circuit suitably used when an output circuit operative on the basis of a supply voltage different from that of the bus hold circuit is connected to a bus line.

In electronic apparatus such as a computer, for instance, signals are usually transferred through a common bus line. FIG. 1 shows an example in which plurality of output circuits are connected to a bus line. In more detail, two output terminals of two output circuits such as two try state buffers TB1 and TB1 are connected to s bus line 101, respectively. These two try state buffers TB1 and TB2 are both of CMOS structure, which are operative on the basis of two different supply voltages Vcc1 and Vcc2, respectively.

The try state buffer TB1 becomes active whenever a low level enable signal/EN1 is inputted thereto, and outputs a signal corresponding to a data signal IN1 to the bus line 101. In the same way, the try state buffer TB2 becomes active whenever a low level enable signal/EN2 is inputted thereto, and outputs a signal corresponding to a data signal IN2 to the bus line 101. On the other hand, whenever the enable signals/EN1 and/EN2 change to a high level, respectively, the two try state buffers TB1 and TB2 become inactive, so that the outputs thereof change to a high impedance state, respectively.

In addition, in FIG. 1, a bus hold circuit 102 is connected to the bus line 101. This bus hold circuit 102 of flip-flop mechanism can hold a signal level on the bus line 101 at any one of levels of a supply voltage Vcc and a ground voltage Vss. The bus hold circuit 102 is composed of two stages of series-connected inverters IN101 and IN102, and an output terminal of the inverter IN101 and an input terminal of the inverter In102 are connected to the bus line 101, respectively. The two inverters IN101 and IN102 are operative on the basis of a supply voltage Vcc different from both the supply voltages Vcc1 and Vcc2 supplied to the two try state buffers TB1 and TB2.

When any one of the try state buffers TB1 and TB2 outputs a signal to the bus line 101, the potential of the bus line 101 changes to either one of logical [1] or [0] level. This level is held by the bus hold circuit 102. Further, after the two try state buffers TB1 and TB2 have been changed to a high impedance state, respectively, the level of the bus line 101 can be kept held by this bus hold circuit 102. Accordingly, after the two try state buffers TB1 and TB2 have been changed to a high impedance state, respectively, it is possible to prevent the potential level of the bus line 101 from fluctuating due to noise or leak current.

As described above, since the bus hold circuit 102 is provided to hold the logical level of the bus line 101, the driving power of the bus hold circuit 102 is determined low enough not to exert a harmful influence upon the operation of the try state buffers TB1 and TB2 for driving the bus line 101.

By the way, when the try state buffers are constructed as being of CMOS structure, a P-channel MOS transistor and an N-channel MOS transistor are to be arranged on the output stage thereof. As a result, a P-type drain diffusion layer of the P-channel transistor is connected to the output terminal of the try state buffer, so that a parasitic pn junction diode is inevitably formed between the output terminal of the try state buffer and a back gate of the P-channel transistor.

Here, the assumption is made that there exists the relationship between the two supply voltages Vcc1 and Vcc2 supplied to the two try state buffers TB1 and TB2, respectively as Vcc1<Vcc2. Further, in the case where the try state buffer TB2 outputs a signal having a level equal to the supply voltage Vcc2 to the output line 101, if the relationship as Vcc1+ Vf<Vcc2 can be established, where Vf is a built-in voltage of the parasitic pn junction formed between the output terminal of the try state buffer TB2 and the drain diffusion layer of the P-channel transistor of the output stage, the parasitic diode is biased in the forward direction. As a result, unnecessary current flows from supply voltage (Vcc2) terminal to the supply voltage (Vcc1) terminal via the parasitic diode.

To overcome this problem involved in the try state buffers, the same Applicant has already proposed circuits as shown in FIGS. 2 and 3, in Japanese Patent Application No. 6-19432. However, in the case of the bus hold circuit, there exists the problem similar to the above-mentioned try state buffers.

FIG. 4 shows an example of prior art bus hold circuits. In this prior art bus hold circuit, an inverter IN102 composed of two series-connected P-channel transistor P101 and N-channel transistor N101 and another inverter IN101 composed of two series-connected P-channel transistor P102 and N-channel transistor N102 are connected in parallel to each other between a supply voltage Vcc and a ground voltage Vss. Further, an input terminal of the inverter IN102 and an output terminal of the inverter IN101 are connected in common to an output terminal Lout connected to a bus line 101.

Here, the assumption is made that there exists the relationship between two supply voltages Vcc1 and Vcc2 supplied to the two try state buffers TB1 and TB2 and the supply voltage Vcc supplied to the bus hold circuit as Vcc <Vcc1<Vcc2. Further, when the level of the bus line 101 becomes equal to any one of the supply voltages Vcc1 and Vcc2, the relationship as Vcc1+Vf<Vcc1<Vcc2 can be established, where Vf is a built-in potential of a parasitic pn junction diode PND101 formed between a drain diffusion layer and a back gate of the P-channel transistor P102 of the output stage inverter IN101 connected to the output terminal Lout of the bus hold circuit. In this case, the pn junction parasitic diode PND101 is biased in the forward direction. As a result, unnecessary current flows from the output terminal Lout at the supply voltage Vcc1 or the supply voltage Vcc2 to the supply voltage (Vcc) terminal via this parasitic diode PND101.

As described above, in the prior art bus hold circuit, when an output circuit supplied with a supply voltage different from that of the bus hold circuit is connected to the bus line, there exists a problem in that unnecessary current flows to the supply voltage terminal due to the presence of a parasitic diode formed in the bus hold circuit.

SUMMARY OF THE INVENTION

Accordingly, it is the object of the present invention to provide a bus hold circuit which can prevent unnecessary current from flowing to the supply voltage terminal of the bus hold circuit, even if an output circuit supplied with a supply voltage different from that of the bus hold circuit is connected to the bus line.

To achieve the above-mentioned object, the present invention provides a bus hold circuit, comprising: an input stage inverter connected between a first supply voltage terminal and a second supply voltage terminal and including: a first P-channel transistor; and a first N-channel transistor connected in series to said first P-channel transistor, a gate of said first P-channel transistor and a gate of said first N-channel transistor being connected in common to a bus line; and an output stage inverter also connected between the first supply voltage terminal and the second supply voltage terminal and including: a second P-channel transistor; a third P-channel transistor connected in series to said second P-channel transistor; and a second N-channel transistor connected in series to said third P-channel transistor, a gate of said second P-channel transistor being connected to the bus line, a gate of said third P-channel transistor and a gate of said second N-channel transistor being connected in common to a drain of said first P-channel transistor and a drain of said first N-channel transistor, a drain of said third P-channel transistor and a drain of said second N-channel transistor being connected in common to the bus line, and wherein back gates of said first, second and third P-channel transistors are all connected to a source of said third P-channel transistor, respectively.

In the bus hold circuit according to the present invention, in the input stage inverter connected to the bus line and the output stage inverter connected between the output side of the input stage inverter and the bus line, the second and third P-channel transistors and the second N-channel transistors are connected in series between the first supply voltage and the second supply voltage. Here, since the back gates of at least the second and third P-channel transistors are connected to the source of the third P-channel transistor, even when a potential higher than the supply voltage is applied to the bus line, since a reverse bias voltage is applied between a parasitic diode formed between source and the back gate of the second P-channel transistor, it is possible to prevent unnecessary current from flowing to the first supply voltage terminal.

Here, it is preferable to connect the fourth P-channel transistor having the gate and drain connected to each other between the first supply voltage terminal and the third P-channel transistor.

Further, when the output terminal is connected to the output side of the input stage inverter, it is possible to connect this output terminal to the input side of another circuit connected to the bus line.

Further, in the bus hold circuit, it is also preferable to connect the back gate of the first P-channel transistor to the first supply voltage terminal.

Further, it is also preferable that a threshold value of the input stage inverter is set equal to or less than a threshold value of another circuit for receiving signals from the bus line. Further, it is also preferable that the second and third P-channel transistors are formed in an N-type well different from an N-type well for forming a P-channel transistor included in another circuit connected to the bus line. Further, it is also preferable that the first, second and third P-channel transistors are all formed in an N-type well formed in a surface of a P-type semiconductor substrate.

BRIEF DESCRIPTION OF THE DRAWINGS

FIG. 1 is a block diagram showing a bus line to which a bus hold circuit and an output circuit are connected;

FIG. 5 is a circuit diagram showing a first embodiment of the bus hold circuit according to the present invention;

FIG. 6 is a circuit diagram showing a second embodiment of the bus hold circuit according to the present invention;

FIG. 9 is a circuit diagram showing a first modification of the first embodiment of the bus hold circuit according to the present invention;

FIG. 10 is a circuit diagram showing a first modification of the second embodiment of the bus hold circuit according to the present invention;

FIG. 11 is a circuit diagram showing a first modification of the third embodiment of the bus hold circuit according to the present invention;

FIG. 12 is a circuit diagram showing a first modification of the fourth embodiment of the bus hold circuit according to the present invention;

FIG. 13 is a circuit diagram showing a second modification of the first embodiment of the bus hold circuit according to the present invention;

FIG. 14 is a circuit diagram showing a second modification of the second embodiment of the bus hold circuit according to the present invention;

FIG. 15 is a circuit diagram showing a second modification of the third embodiment of the bus hold circuit according to the present invention;

FIG. 16 is a circuit diagram showing a third modification of the fourth embodiment of the bus hold circuit according to the present invention;

FIG. 17 is a circuit diagram showing a third modification of the fourth embodiment (the first modification) of the bus hold circuit according to the present invention.

FIG. 18 is a circuit diagram showing a modification of the embodiment shown in FIG. 7 of the bus hold circuit according to the present invention; and FIG. 19 is a circuit diagram showing a modification of the embodiment shown in FIG. 11 of the bus hold circuit according to the present invention.

DETAILED DESCRIPTION OF THE PREFERRED EMBODIMENTS

Figure 2:
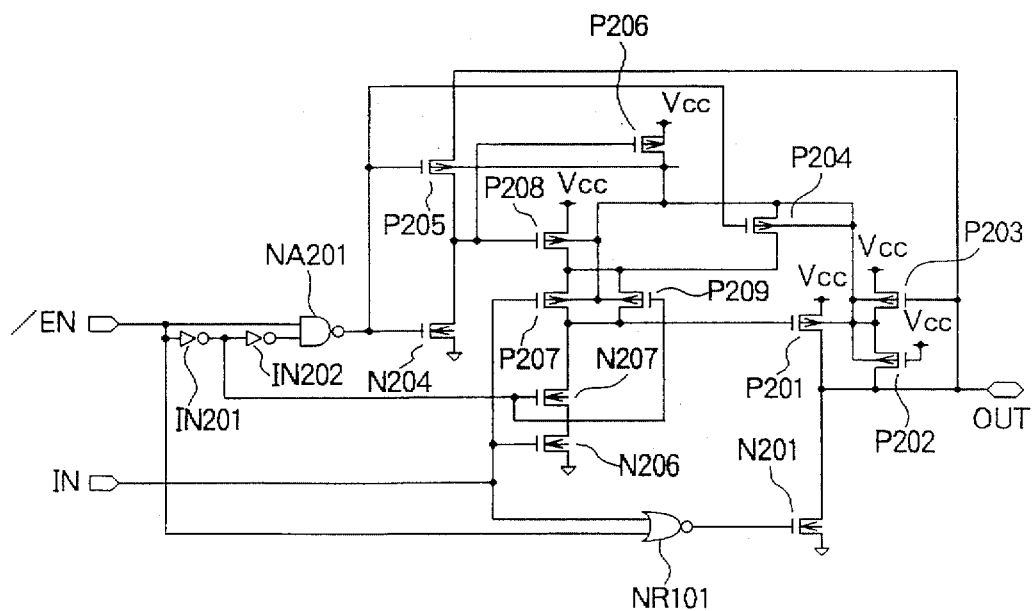
FIG. 2 is a circuit diagram showing a prior art output circuit.

Embodiments of the bus hold circuit according to the present invention will be described hereinbelow with reference to the attached drawings.

FIG. 5 shows a first embodiment of the bus hold circuit. In FIG. 5, an inverter IN1 is connected between a supply voltage (Vcc) terminal and a ground voltage (Vss) terminal. The inverter IN1 is composed of a P-channel transistor P1 and an N-channel transistor N1 both connected to each other in series. An input terminal of this inverter IN1 is connected to an output terminal Lout connected to a bus line (not shown). Further, an output terminal L1 of the inverter IN1 is connected to an input terminal of an inverter IN2. The inverter IN2 is composed of a P-channel transistor P2 and an N-channel transistor N2. Further, an output terminal of the inverter IN2 is connected to the output terminal Lout.

In addition, a P-channel transistor P3 having a gate connected to a drain thereof is connected between a source of the P-channel transistor P2 of the inverter IN2 and the supply voltage (Vcc) terminal. Further, in parallel to this P-channel transistor P3, a P-channel transistor P4 is connected between the supply voltage (Vcc) terminal and a source of the P-channel transistor P2. A gate of the P-channel transistor P4 is connected to the output terminal Lout.

Further, the back gates of the P-channel transistors P1 to P4, that is, an N well for forming the transistors P1 to P4 are all connected to the source of the P-channel transistor P2. Further, the back gates of the N-channel transistors N1 and N2 are connected in common to the ground voltage (Vss).

The operation of the first embodiment of the bus hold circuit according to the present invention will be described hereinbelow.

(1) When an output circuit connected to the bus line connected to the output terminal Lout outputs the ground voltage Vss, and after that an output of the output circuit changes to a high impedance state:

When the output terminal Lout is at the ground voltage Vss, the inverter IN1 outputs the supply voltage Vcc, so that the P-channel transistor P2 of the inverter IN2 is turned off and the N-channel transistor N2 of the inverter IN2 is turned on. Therefore, the potential of the output terminal Lout connected to the output terminal of the inverter IN2 is held at the ground voltage Vss. Further, since the ground voltage Vss is applied to the gate of the P-channel transistor P4, the transistor P4 is turned on, so that the drains of the P-channel transistors P4 and P3 and the source of the P-channel transistor P2 change to the supply voltage Vcc. As a result, there exists no high impedance node inside the circuit.

(2) When the output circuit connected to the bus line connected to the output terminal Lout outputs the supply voltage Vcc1 or Vcc2 higher than the supply voltage Vcc, and after that the output of the output circuit changes to a high impedance state:

The potential Vcc1 or Vcc2 of the output terminal Lout is inputted to the inverter IN1 and the ground voltage Vss is outputted to the inverter IN2. Therefore, the P-channel transistor P2 of the inverter IN2 is turned on and the N-channel transistor N2 of the inverter IN2 is turned off. Therefore, the potential Vcc1 or Vcc2 of the output terminal Lout is transmitted to. the P-channel transistor P2, so that the potential Of the output terminal of the inverter IN2 changes to Vcc1 or Vcc2. In this case, however, this potential is not held from the static standpoint, as described later.

Further, since the P-channel transistor P2 is turned on, the N-type well NW1 connected to the source of this transistor P2 changes to the potential the same as Vcc1 or Vcc2 from the dynamical standpoint. Further, the P-channel transistor P3 and P3 are both turned off, because the gate and the source thereof are at the same potential, respectively.

Further, there exists a parasitic pn junction diode PND1 between the source of the P-channel transistor P3 and the N-type well NW1. Further, since the potential Vcc1 or Vcc2 of the N-type well NW1 is higher than the source potential Vcc of the P-channel transistor P3, a reverse bias voltage is applied to the diode PND1. Therefore, even if a potential higher than the supply voltage Vcc is applied to the output terminal Lout, it is possible to prevent unnecessary current from flowing to the supply voltage (Vcc) terminal.

(3) When the potential Vcc1 or Vcc2 of the output terminal Lout decreases below the supply voltage Vcc due to a leak current:

Here, a threshold voltage of the P-channel transistors P3 and P4 is denoted by Vtp (a negative value); a built-in potential of the pn junction of the diode PND1 is denoted by Vf; and the potential of the output terminal Vout is denoted by Vout. When the following formula (1) can be established between the supply voltage Vcc and the potential Vout:

$$Vcc-|Vtp|<Vout \leq Vcc \quad (1)$$

the P-channel transistor P4 is kept turned off, and further the P-channel transistor P3 is also kept turned off.

In this case, since the potential of the output terminal Lout can be pulled up to the supply voltage Vcc by the parasitic pn junction diode PND1, the potential Vout of the output terminal Lout can be expressed as the following formula (2):

$$Vout = Vcc - Vf + tm \quad (2)$$

Here, if the leak current to the supply voltage (Vcc) terminal is large and thereby the potential Vout reaches the voltage (Vcc−|Vtp|), the P-channel transistors P3 and P4 are both turned on. Therefore, a power to pull up the potential Vout can be increased. Therefore, even if the potential Vout drops below the voltage (Vcc−|Vtp|) momentarily due to the influence of supply voltage noise, the potential Vout at the output terminal Lout can be pulled up by the parasitic pn junction diode PND1 and the P-channel transistors P3 and P4.

Accordingly, since the drive capability of the diode PND1 and the P-channel transistors P3 and P4 can be set to any desired values, respectively, an appropriately large pull-up current can be obtained, so that the relationship between Vcc−|Vtp|<Vout can be realized.

As described above, in this first embodiment, the voltage Vout of the output terminal Vout can be held in the range as defined by the formula (1). On the other hand, it is necessary that the held potential Vout as described above can be recognized as a high level in the input circuit connected to the bus line. However, when the threshold voltage of the input circuit is denoted by Vthc, as far as this threshold voltage Vthc can satisfy the relationship as Vthc<Vcc−|Vtp|, it is possible to recognize the held voltage Vout as a high level without any problem.

A second embodiment to the bus hold circuit according to the present invention will be described hereinbelow with reference to FIG. 6. This second embodiment is different from the first embodiment shown in FIG. 5 in that an output node L1 of the inverter IN1 is led out as an input signal INA to another input circuit (not shown) and further in that the back gate of the P-channel transistor P1 is connected to the supply voltage (Vcc) terminal. The construction other than the above is the same as with the case of the first embodiment, so that the second embodiment operates in the same as with the case of the first embodiment, to hold the potential at the output terminal Lout.

Further, the feature of this second embodiments reside in that the inverter IN1 is provided with the original function as the initial stage inverter of the bus hold circuit and with the other function as an input stage inverter of another input circuit for receiving the potential outputted to the bus line. Accordingly, the following effects can be obtained:

(1) The proportion in occupied area of the inverters to the total integrated circuit can be reduced.

(2) The threshold value of the initial stage of the bus hold circuit can be. perfectly equalized to the threshold value of the inverter of the input circuit for receiving the potential outputted to the bus line. Therefore, in comparison with the case where these inverters are formed separately, it is possible to increase the tolerance against fluctuations in signal level on the bus line due to supply voltage noise, for instance. Further, in order to increase the tolerance against noise, it is preferable to set the threshold value of the initial stage inverter IN1 below the minimum threshold value of the other input circuit for receiving the signals on the bus line.

Further, when the inverters are provided separately, in order to increase the tolerance against noise as described in item (2) above, it is preferable that a driving rate of the P-channel transistor P1 and the N-channel transistor N1 of the initial stage inverter IN1 is equalized to a driving rate of the inverter circuit (not shown) for receiving the signals on the bus line held by this bus hold circuit.

Figure 7:
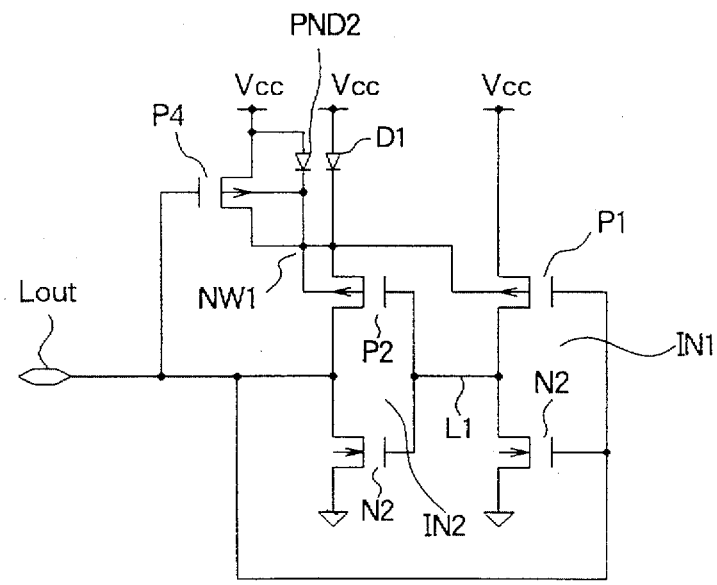
FIG. 7 is a circuit diagram showing a third embodiment of the bus hold circuit according to the present invention.

A third embodiment of the bus hold circuit according to the present invention will be described hereinbelow with reference to FIG. 7. The feature of this third embodiment is that a pn junction diode D1 (not a parasitic diode) is additionally formed, by removing the P-channel transistor P3 of the first embodiment shown in FIG. 5. In FIG. 7, the same reference numerals have been retained for similar elements having the same functions as with the case of the first embodiment, without repeating the similar description thereof.

In this third embodiment, in the same way as with the case of the first and second embodiments, when a voltage higher than the supply voltage Vcc is applied to the output terminal Lout, it is possible to prevent unnecessary current from flowing to the supply voltage (Vcc) terminal. In comparison with the first embodiment, since the P-channel transistor P3 is eliminated, although the capability for pulling up the N-type well NW1 is relatively low, it is possible to pull up the N-type well NW1 by the P-channel transistor P4 and a parasitic pn junction formed between the source and back gate of this P-channel transistor P4, in addition to the newly added diode D1.

Figure 8:
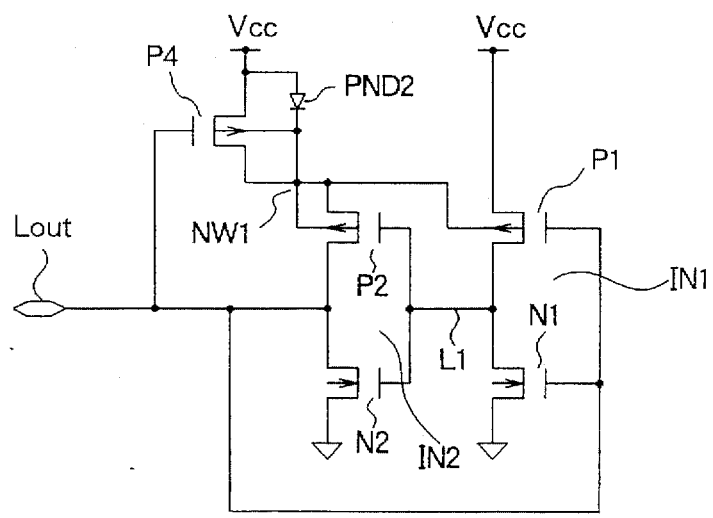
FIG. 8 is a circuit diagram showing a fourth embodiment of the bus hold circuit according to the present invention.

A fourth embodiment of the bus hold circuit according to the present invention will be described hereinbelow with reference to FIG. 8. This fourth embodiment is different from the first embodiment shown in FIG. 5 in that the P-channel transistor P3 is removed. The N-type well NW1 can be pulled up by the P-channel transistor P4 and a parasitic pn junction formed between the source and back gate of this P-channel transistor P4. The driving capability of pulling up the N-type well NW1 of this fourth embodiment is relatively lower than that of the first embodiment including the P-channel transistor P3 or the second embodiment including the diode D1.

The above-mentioned embodiments have been described only by way of example. Accordingly, the present invention is not limited only to the above-mentioned first to fourth embodiments.

For instance, a first modification will be described hereinbelow. In the first to fourth embodiments as shown in FIGS. 5 to 8, the back gate of the P-channel transistor P1 can be connected to the supply voltage (Vcc) terminal, as shown in FIGS. 9 to 12, respectively, instead of connection to the N-type well NW1. In this case, however, it is necessary to electrically isolate an N-type well for forming the P-channel transistor P1 from an N-type well for forming the P-channel transistors P2 to P4, in such a way that the back gate potential of the P-channel transistor P1 differs from the back gate potential of the P-channel transistors P2 to P4. Therefore, in this first modification, since all the P-channel transistors cannot be formed in the same N-type well, the area occupied by the bus hold circuit of this first modification is increased, as compared with the first to fourth embodiments.

Further, a second modification will be described. In the first to third embodiments as shown in FIGS. 5 to 7, the P-channel transistor P4 can be removed, as shown in FIGS. 13 to 15, respectively. In the P-channel transistor P4, however, being different from the P-channel transistor P3, since the potential of the output terminal Lout is directly inputted to the gate thereof, the sensitivity of the P-channel transistor P4 to the potential change at the terminal Lout is high. Therefore, in order to increase the responsibility to the potential change at the output terminal Lout, it is preferable to provide the P-channel transistor P4 for the bus hold circuit.

Further, a third modification will be described hereinbelow. In the third embodiment as shown in FIG. 7, the fourth embodiment as shown in FIG. 8, the modification of the third embodiment as shown in FIG. 11, and the modification of the fourth embodiment as shown in FIG. 12, it is possible to lead out a node L1 of the bus hold circuit, respectively and further to use the potential at this node L1 as an input signal INA for another input circuit (not shown), as shown in FIGS. 16, 17, 18, and 19 respectively.

Figure 3:
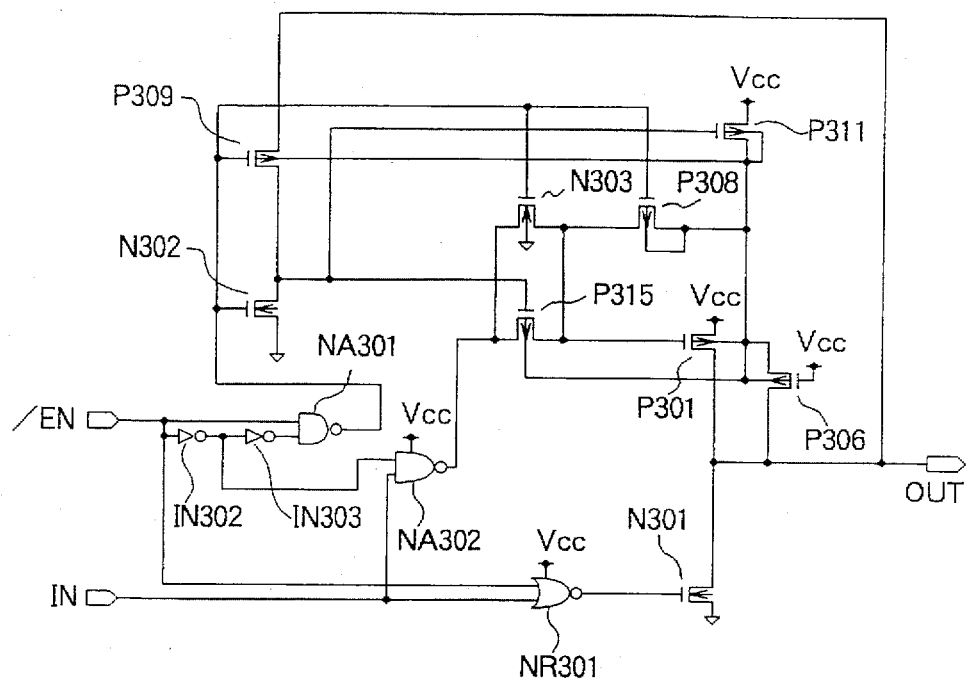
FIG. 3 is a circuit diagram showing another prior art output circuit.
Figure 4:
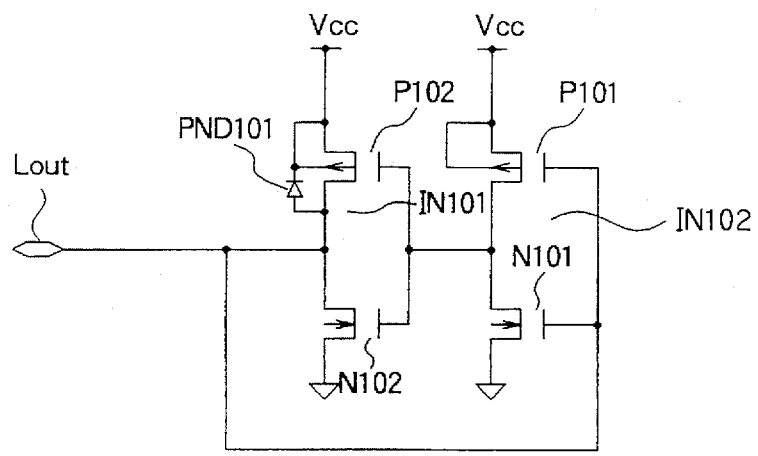
FIG. 4 is a circuit diagram showing a prior art bus hold circuit.

By the way, it is preferable that the back gate of the P-channel transistor (e.g., the P-channel transistor P201 shown in FIG. 2 or the P-channel transistor P301 shown in FIG. 3) of the try state buffer connected to the bus line is formed in an N-type well different from an N-type well for forming the P-channel transistors of the present invention, in order that the back gate potential of the try state buffer connected to the bus line is not equalized to the back gate potential of the P-channel transistors of the bus hold circuit according to the present invention. This reason is as follows: during the process that the bus line potential rises from the ground potential Vss to the supply voltage potential Vcc by the output circuit, when the potential of the output terminal Lout shown in FIG. 5 begins to rise up to the supply potential Vcc and further the output node L1 of the initial stage inverter begins to fall down to the ground potential Vss, the P-channel transistor P2 is turned on and the N-channel transistor N2 turned off. As a result, the potential at the output terminal Lout is transmitted to the N-type well NW1 via the source of the P-channel transistor P2, so that there arises such a phenomenon that the potential at the N-type well NW1 (at a potential near Vcc−Vf) is pulled down momentarily.

In this case, in the case where the P-channel transistor (e.g., the P-channel transistor P201 shown in FIG. 2 or the P-channel transistor P301 shown in FIG. 3) of the output stage of the other output circuit which does not drive the bus line is formed on the same N-type well for forming the P-channel transistors of the present invention, the back gate potential of the P-channel transistor of the output stage of the other output circuit is also pulled down at the same time. As a result, the P-channel transistor of the output stage of the other output circuit originally deactivated is turned on, so that there exists a problem in that unnecessary current flows to the supply voltage terminal via this turned on P-channel transistor. Accordingly, it is preferable to form the P-channel transistor of the output stage of the other output circuit on an N-type well electrically separated from the N-type well for forming the P-channel transistors of the bus hold circuit according to the present invention, in such a way that the back gate of the P-channel transistor of the output stage of the other output circuit differs in potential from the back gates of the P-channel transistors of the bus hold circuit according to the present invention.

Further, in the bus hold circuit according to the present invention, the P-channel transistors of the bus hold circuit can be formed on the surface of an N-type well formed on the surface of the P-type semiconductor substrate. Further, the P-channel transistors of the bus hold circuit can be formed in such a way that a deep P-type well is first formed in an N-type semiconductor substrate; an N-type well is formed in the deep P-type well; and the P-channel transistors are formed in the N-type well formed in the deep P-type well, in sequence.

What is claimed is:

1. A bus hold circuit, comprising:
an input stage inverter connected between a first supply voltage terminal and a second supply voltage terminal, said input stage inventer, including:
a first P-channel transistor; and
a first N-channel transistor connected in series to said first P-channel transistor, a gate of said first P-channel transistor and a gate of said first N-channel transistor being connected in common to a bus line; and
an output stage inverter also connected between the first supply voltage terminal and the second supply voltage terminal, said output stage inventer including:
a second P-channel transistor;
a third P-channel transistor connected in series to said second P-channel transistor; and
a second N-channel transistor connected in series to said third P-channel transistor, a gate of said second P-channel transistor being connected to the bus line, a gate of said third P-channel transistor and a gate of said second N-channel transistor being connected in common to a drain of said first P-channel transistor and a drain of said first N-channel transistor, a drain of said third P-channel transistor and a drain of said second N-channel transistor being connected in common to the bus line, and
wherein back gates of said first, second and third P-channel transistors are all connected to a source of said third P-channel transistor, respectively.

2. The bus hold circuit of claim 1, wherein said bus hold circuit further comprises an output terminal connected to the drains of said first P-channel transistor and said first N-channel transistor.

3. The bus hold circuit of claim 1, wherein a threshold voltage of said input stage inverter is set equal to or less than a threshold voltage of another circuit for receiving signals from the bus line.

4. The bus hold circuit of claim 1, wherein said second and third P-channel transistors are formed in an N-type well different from an N-type well for forming a P-channel transistor included in another circuit connected to the bus line.

5. The bus hold circuit claim 1, wherein said bus hold circuit further comprises a fourth P-channel transistor connected between the first supply voltage terminal and a source of said third P-channel transistor, a gate of said fourth P-channel transistor is connected to a drain of said fourth P-channel transistor, and a back gate of said fourth P-channel transistor is connected to the source of said third P-channel transistor.

6. The bus hold circuit of claim 5, wherein said bus hold circuit further comprises an output terminal connected to the drains of said first P-channel transistor and said first N-channel transistor.

7. The bus hold circuit of claim 1, wherein said bus hold circuit further comprises a diode connected between the first supply voltage and a source of said third P-channel transistor.

8. The bus hold circuit of claim 7, wherein said bus hold circuit further comprises an output terminal connected to the drains of said first P-channel transistor and said first N-channel transistor.

9. A bus hold circuit, comprising:
an input stage inverter connected between a first supply voltage terminal and a second supply voltage terminal, said input stage inventer including:
a first P-channel transistor; and
a first N-channel transistor connected in series to said first P-channel transistor, a gate of said first P-channel transistor and a gate of said first N-channel transistor being connected in common to a bus line; and
an output stage inverter also connected between the first supply voltage terminal and the second supply voltage terminal, said output stage inventer including:
a second P-channel transistor;
a third P-channel transistor connected in series to said second P-channel transistor; and
a second N-channel transistor connected in series to said third P-channel transistor, a gate of said second P-channel transistor being connected to the bus line, a gate of said third P-channel transistor and a gate of said second N-channel transistor being connected in common to a drain of said first P-channel transistor and a drain of said first N-channel transistor, a drain of said third P-channel transistor and a drain of said second N-channel transistor being connected in common to the bus line, and
wherein a back gate of said first P-channel transistor is connected to the first supply voltage, and back gates of said second and third P-channel transistors are both connected to a source of said third P-channel transistor, respectively.

10. The bus hold circuit of claim 9, wherein said bus hold circuit further comprises an output terminal connected to the drains of said first P-channel transistor and said first N-channel transistor.

11. The bus hold circuit of claim 9, wherein a threshold voltage of said input stage inverter is set equal to or less than a threshold voltage of another circuit for receiving signals from the bus line.

12. The bus hold circuit of claim 9, wherein said second and third P-channel transistors are formed in an N-type well different from an N-type well for forming a P-channel transistor included in another circuit connected to the bus line.

13. The bus hold circuit of claim 9, wherein said bus hold circuit further comprises a fourth P-channel transistor connected between the first supply voltage terminal and a source of said third P-channel transistor, a gate of said fourth P-channel transistor is connected to a drain of said fourth P-channel transistor, and a back gate of said fourth P-channel transistor is connected to the source of said third P-channel transistor.

14. The bus hold circuit of claim 13, wherein said bus hold circuit further comprises an output terminal connected to the drains of said first P-channel transistor and said first N-channel transistor.

15. The bus hold circuit of claim 9, wherein said bus hold circuit further comprises a diode connected between the first supply voltage and a source of said third P-channel transistor.

16. The bus hold circuit of claim 15, wherein said bus hold circuit further comprises an output terminal connected to the drains of said first P-channel transistor and said first N-channel transistor.

17. A bus hold circuit, comprising:
an input stage inverter connected between a first supply voltage terminal and a second supply voltage terminal, said input stage inventer, including:

a first P-channel transistor; and a first N-channel transistor connected in series to said first P-channel transistor, a gate of said first P-channel transistor and a gate of said first N-channel transistor being connected in common to a bus line; and an output stage inverter also connected between the first supply voltage terminal and the second supply voltage terminal, said output stage inventer including:

a second P-channel transistor;

a third P-channel transistor connected in series to said second P-channel transistor; and a second N-channel transistor connected in series to said third P-channel transistor, a gate of said second P-channel transistor being connected to a drain of said second P-channel transistor, a gate of said third P-channel transistor and a gate of said second N-channel transistor being connected in common to a drain of said first P-channel transistor and a drain of said first N-channel transistor, a drain of said third P-channel transistor and a drain of said second N-channel transistor being connected in common to the bus line, and wherein back gates of said first, second and third P-channel transistors are all connected to a source of said third P-channel transistor, respectively.

18. The bus hold circuit of claim 17, wherein said bus hold circuit further comprises an output terminal connected to the drains of said first P-channel transistor and said first N-channel transistor.

19. The bus hold circuit of claim 17, wherein a threshold voltage of said input stage inverter is set equal to or less than a threshold voltage of another circuit for receiving signals from the bus line.

20. The bus hold circuit of claim 17, wherein said second and third P-channel transistors are formed in an N-type well different from an N-type well for forming a P-channel transistor included in another circuit connected to the bus line.

21. A bus hold circuit, comprising:

an input stage inverter connected between a first supply voltage terminal and a second supply voltage terminal, said input stage inventer, including:

a first P-channel transistor; and a first N-channel transistor connected in series to said first P-channel transistor, a gate of said first P-channel transistor and a gate of said first N-channel transistor being connected in common to a bus line; and an output stage inverter also connected between the first supply voltage terminal and the second supply voltage terminal, said output stage inventer including:

a diode;

a second P-channel transistor connected in series to said diode; and a second N-channel transistor connected in series to said second P-channel transistor, a gate of said second P-channel transistor and a gate of said second N-channel transistor being connected in common to a drain of said first P-channel transistor and a drain of said first N-channel transistor, a drain of said third P-channel transistor and a drain of said second N-channel transistor being connected in common to the bus line, and wherein back gates of said first and second P-channel transistors are all connected to a source of said third P-channel transistor, respectively.

22. The bus hold circuit of claim 21, wherein a threshold voltage of said input stage inverter is set equal to or less than a threshold voltage of another circuit for receiving signals from the bus line.

23. The bus hold circuit of claim 21, wherein said second P-channel transistors are formed in an N-type well different from an N-type well for forming a P-channel transistor included in another circuit connected to the bus line.

* * * * *